United States Patent
Tokumitsu et al.

(10) Patent No.: US 10,751,903 B2
(45) Date of Patent: Aug. 25, 2020

(54) PROCESSING LIQUID SUPPLYING APPARATUS

(71) Applicant: DISCO CORPORATION, Tokyo (JP)

(72) Inventors: Naoya Tokumitsu, Tokyo (JP); Satoshi Arai, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 11 days.

(21) Appl. No.: 15/901,090

(22) Filed: Feb. 21, 2018

(65) Prior Publication Data

US 2018/0236684 A1 Aug. 23, 2018

(30) Foreign Application Priority Data

Feb. 23, 2017 (JP) ................................. 2017-031800

(51) Int. Cl.
  *B26F 3/00* (2006.01)
  *H01L 21/67* (2006.01)
  *H05F 1/00* (2006.01)
  *B26D 7/08* (2006.01)

(52) U.S. Cl.
  CPC .............. *B26F 3/004* (2013.01); *B26D 7/088* (2013.01); *H01L 21/67017* (2013.01); *H01L 21/67092* (2013.01); *H01L 21/67288* (2013.01); *H05F 1/00* (2013.01)

(58) Field of Classification Search
  CPC .. B01F 15/0425; G05D 7/0635; G01G 17/06; B26F 3/004; H01L 21/67017
  See application file for complete search history.

(56) References Cited

U.S. PATENT DOCUMENTS

| | | | | |
|---|---|---|---|---|
| 4,411,649 A | * | 10/1983 | Kamen | ............ A61M 5/16895 |
| | | | | 128/DIG. 13 |
| 4,778,450 A | * | 10/1988 | Kamen | ............ A61M 5/16895 |
| | | | | 128/DIG. 13 |
| 5,380,485 A | * | 1/1995 | Takahashi | ............ B01J 19/0006 |
| | | | | 422/106 |
| 2014/0224829 A1 | * | 8/2014 | Capone | .................. F04B 49/06 |
| | | | | 222/23 |

FOREIGN PATENT DOCUMENTS

JP 2015046550 A 3/2015

* cited by examiner

*Primary Examiner* — Elizabeth Insler
(74) *Attorney, Agent, or Firm* — Greer Burns & Crain, Ltd.

(57) ABSTRACT

A processing liquid supplying apparatus including a reservoir containing an additive to be added to a liquid flowing through a passage connected at one end to a liquid supply source and at another end to a processing apparatus; an injection pump for injecting the additive into the passage; a weight measuring unit for measuring the weight of the reservoir and converting the weight into an electrical signal at a predetermined interval while the liquid flows in the passage and the additive is injected; a deciding unit for receiving the electrical signal from the weight measuring unit and deciding whether the measured value of the weight of the reservoir is being reduced at a predetermined rate; and a warning unit for issuing a warning that injection is improper when it is decided by the deciding unit that the measured value of the weight is not being reduced at the predetermined rate.

15 Claims, 3 Drawing Sheets

PROCESSING LIQUID SUPPLYING APPARATUS

BACKGROUND OF THE INVENTION

Field of the Invention

The present invention relates to a processing liquid supplying apparatus for supplying a processing liquid.

Description of the Related Art

In the semiconductor device manufacturing process, a semiconductor wafer formed with a plurality of devices is divided along streets, to thereby form semiconductor devices. The division of the semiconductor wafer is performed by a cutting apparatus. In the cutting apparatus, the semiconductor wafer is cut along the streets by a cutting blade rotating at a high speed. In this case, a processing liquid is jetted from a nozzle toward a cutting-in site of the cutting blade, whereby the cutting blade is cooled and swarf is washed away from the semiconductor wafer.

When the processing liquid jetted from the nozzle of processing liquid supplying means is electrostatically charged, however, electrostatic discharge damage to the devices formed on the surface of the semiconductor wafer may be generated, or the swarf may adhere to the semiconductor wafer. In view of this, an additive for antistatic purpose is injected and mixed into the processing liquid, to prevent the processing liquid from being electrostatically charged. The injection of the additive into the processing liquid is conducted by a processing liquid supplying apparatus (see, for example, Japanese Patent Laid-open No. 2015-46550).

SUMMARY OF THE INVENTION

Meanwhile, in the processing liquid supplying apparatus, the additive is injected through an injection pump into a passage in which pure water flows. Since a piping constituting the passage for pure water and the additive is composed of a tube, there have been cases in which a required amount of the additive cannot be injected into pure water due to bending of the tube or intrusion of air or foreign matter such as dust into the tube. In view of this, a method has been investigated in which the conductivity or specific resistance or the like of the processing liquid with the additive injected thereinto is measured, and it is determined, based on the measured value, whether or not a proper quantity of the additive has been injected. According to such a method, however, there is a problem that if an abnormal condition exists in the measuring instrument for measuring the conductivity or specific resistance or the like, a determination that proper injection has been achieved may be erroneously made notwithstanding a proper quantity of the additive has not been injected.

It is therefore an object of the present invention to provide a processing liquid supplying apparatus by which improper injection of an additive into a processing liquid can be determined appropriately.

In accordance with an aspect of the present invention, there is provided a processing liquid supplying apparatus including: a reservoir containing an additive to be added to a liquid flowing through a passage connected at its one end to a liquid supply source and connected at its other end to a processing apparatus; an injection pump adapted to inject the additive in the reservoir into the passage; weight measuring means for measuring the weight of the reservoir and converting the measured value of the weight into an electrical signal at a predetermined interval during when the liquid flows in the passage and the additive is injected; deciding means for receiving the electrical signal from the weight measuring means and deciding whether or not the measured value of the weight of the reservoir is being reduced at a predetermined rate; and warning means for issuing a warning that injection is improper when it is decided by the deciding means that the measured value of the weight is not being reduced at the predetermined rate.

According to this configuration, during when the additive is injected through the injection pump from the reservoir containing the additive into the liquid flowing in the passage, the weight of the reservoir is measured by the weight measuring means, and whether or not the additive is being injected into the liquid is decided based on whether or not the weight is being reduced. As a result of this, in the case where the weight is not being reduced at a predetermined rate, it is known that a predetermined quantity of the additive is not being injected into the liquid, and, therefore, improper injection of the additive can be decided appropriately. In addition, generation of clogging in the course from the reservoir to the passage can be detected immediately.

Preferably, the deciding means calculates an inclination angle of a linear function straight line based on a plurality of measured values of the weight by use of a least squares method at a predetermined time interval, and decides that the measured value of the weight is not being reduced at the predetermined rate when the inclination angle representing the reduction rate comes out of a predetermined range.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
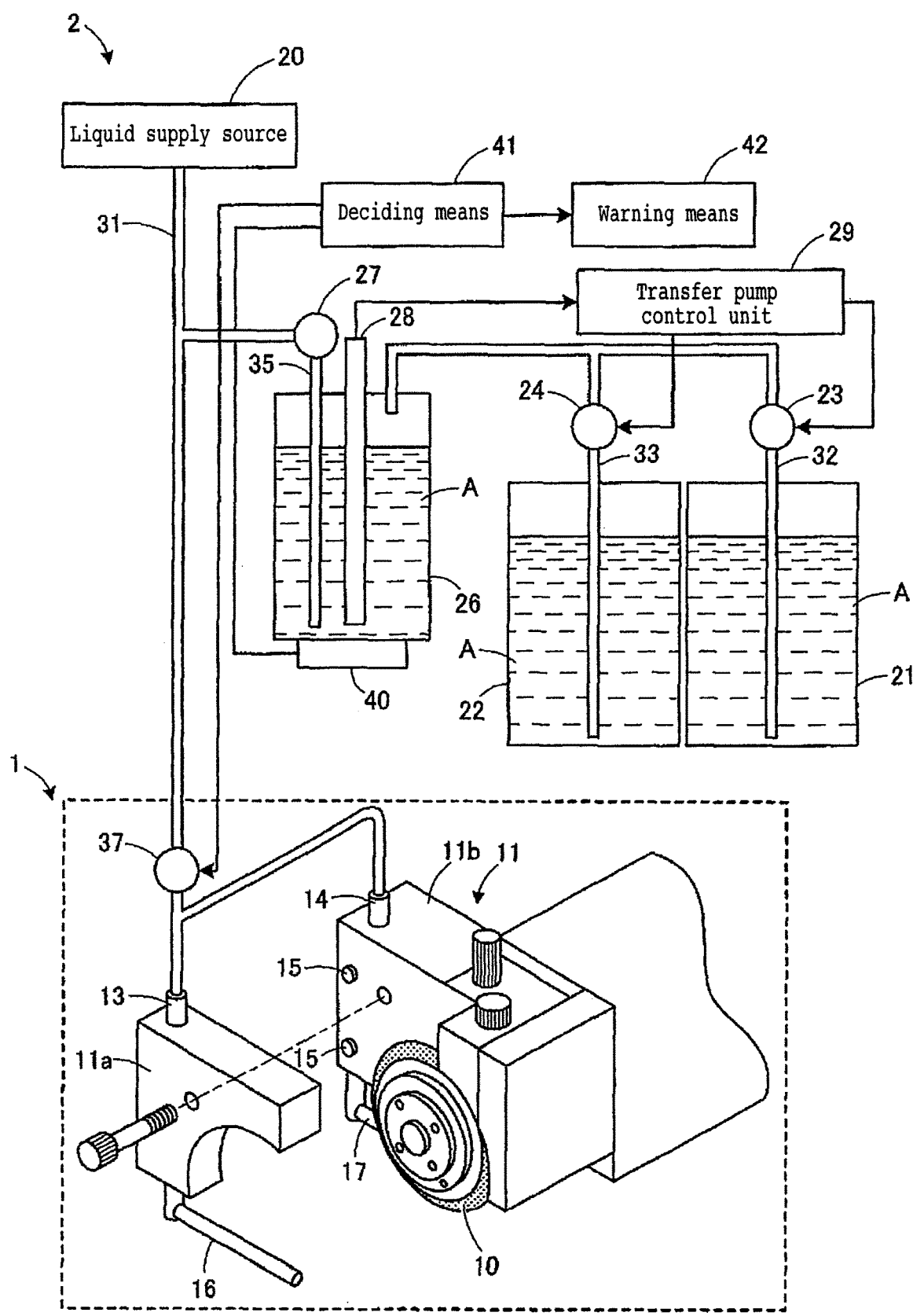
FIG. 1 is a schematic view of a processing liquid supply structure for a cutting apparatus according to the present embodiment.

A processing liquid supply structure for a cutting apparatus will be described below, referring to the attached drawings. FIG. 1 is a schematic view of the processing liquid supply structure for the cutting apparatus according to the present embodiment.

As illustrated in FIG. 1, a processing liquid supplying apparatus 2 is configured such that an additive A for antistatic purpose is injected into a processing liquid which is supplied from a liquid supply source 20 toward a pair of nozzles 16 and 17 of a cutting apparatus 1. The liquid supply source 20 is disposed at a most upstream position of a supply path of the processing liquid. A passage 31 extending from the liquid supply source 20 is connected to joint portions 13 and 14 of a blade cover 11 in the cutting apparatus 1 through a solenoid valve 37. The blade cover 11 is formed with an internal passage, which is connected to the nozzles 16 and 17.

The cutting apparatus 1 cuts a wafer (not shown) by bringing a rotating cutting blade 10 into contact with the wafer. The cutting blade 10 is mounted to one end of a spindle (not shown), and is rotated by a motor (not shown) connected to the other end side of the spindle. The cutting blade 10 is composed, for example, of a cutting edge formed in an annular shape by binding abrasive grains of diamond or the like with a bonding material. The upper side of the cutting blade 10 is covered by the blade cover 11, and the blade cover 11 is composed of a detachable block 11a and a cover main body 11b. When the detachable block 11a is mounted to the cover main body 11b by a bolt, the mounting position is determined by positioning pins 15. The blade cover 11 is provided with the pair of nozzles 16 and 17 disposed on opposite sides of the cutting blade 10, and a processing liquid supplied through the passage 31 is jetted from the nozzles 16 and 17 toward side surfaces of the cutting blade 10.

Note that the cutting blade 10 may be of a washer type or a hub type. In addition, a wafer may be, for example, a semiconductor wafer having a semiconductor substrate formed with semiconductor devices, an optical device wafer having an inorganic material substrate formed with optical devices, a packaged substrate, a semiconductor substrate before formation of semiconductor devices, an inorganic material substrate before formation of optical devices, an oxide wafer, a green ceramic substrate, or a piezoelectric substrate.

A first additive container 21 and a second additive container 22 in which the additive A is contained are disposed on an upstream side of the supply path of the additive A. A first transfer pump 23 and a second transfer pump 24 are disposed respectively in a passage 32 and a passage 33 extending from the first additive container 21 and the second additive container 22 toward a reservoir 26. By the first transfer pump 23 and the second transfer pump 24, the additive A contained in the first additive container 21 and the second additive container 22 is transferred to the reservoir 26 through the passage 32 and the passage 33, respectively.

An injection pump 27 is disposed in a passage 35 extending from the reservoir 26 toward the passage 31. By the injection pump 27, the additive A reserved in the reservoir 26 is injected into the passage 31 through the passage 35. The passage 31 and the passage 35 are interconnected, and the additive A injected into the passage 31 by the injection pump 27 is mixed with a liquid, such as pure water, supplied from the liquid supply source 20, in the passage 31. The pure water and the additive A thus mixed are together supplied as a processing liquid to the nozzles 16 and 17 of the cutting apparatus 1.

As the additive A, there can be used, for example, anionic, cationic, nonionic or the like organic additives, inorganic additives such as ammonia, etc., carbon dioxide gas, and surfactants. As the cationic additive, there can be used, for example, polyethyleneimine and dicyandiamide. With the additive A added to the processing liquid, electrostatic charging of the processing liquid is prevented.

In addition, a liquid level detection sensor 28 for detecting the water level of the additive A is disposed inside the reservoir 26. The liquid level detection sensor 28 is connected to a transfer pump control unit 29, which controls operations of the first transfer pump 23 and the second transfer pump 24. When it is detected by the liquid level detection sensor 28 that the liquid level of the additive A in the reservoir 26 has been lowered below a predetermined height, either one of the first transfer pump 23 and the second transfer pump 24 is operated by the transfer pump control unit 29, whereby the additive A in the first additive container 21 or the second additive container 22 is transferred into the reservoir 26.

Thus, for preventing electrostatic charging of the processing liquid jetted from the nozzles of the cutting apparatus, the additive for antistatic purpose is added to pure water serving as a principal processing liquid. As has been described above, in the processing liquid supplying apparatus, the mixing of the additive into pure water is conducted by injection of the additive through the injection pump into the passage in which the pure water flows. However, mixing of a predetermined quantity of the additive has been failed for some reason. It has been found out by the present inventors that the reason lies in that the injection of the additive into pure water is hampered because of bending of a tube constituting the passage through which the additive flows or because of idle running of the injection pump caused by intrusion of foreign matter into the tube.

For checking whether or not a predetermined quantity of the additive is being injected into the processing liquid, a method has been investigated in which a measuring instrument is disposed in the passage to measure the conductivity, specific resistance or the like of the processing liquid admixed with the additive, thereby measuring the concentration of the additive in the processing liquid. However, in the case where the concentration of the additive is not a predetermined value, the reason is considered to be a trouble in the measuring instrument, or measurement at a part where mixing of pure water and the additive has not yet been achieved sufficiently, in addition to the improper injection of the additive due to clogging of the tube as above-mentioned; thus, it has been difficult to determine the reason. In view of this, in the present embodiment, the weight of the reservoir in which the additive is reserved is measured by weight measuring means, and the manner in which the amount of the additive is reduced is monitored, thereby to decide improper injection of the additive and decide whether or not a trouble has been generated in the passage through which the additive flows.

Weight measuring means 40 and a configuration in which a reduction in the weight of the additive A measured by the weight measuring means 40 is decided according to the present embodiment will be described below. The reservoir 26 is disposed on the weight measuring means 40, and the weight measuring means 40 measures the weight of the reservoir 26 in which the additive A is reserved. The weight measuring means 40 is composed, for example, of a load converter (load cell). During when the additive A in the reservoir 26 is injected into the passage 31 in which pure water supplied from the liquid supply source 20 flows, the weight measuring means 40 measures the weight of the reservoir 26, converts the measured value of the weight into an electrical signal, and sends the electrical signal to deciding means 41 connected to the weight measuring means 40, at a predetermined interval.

The deciding means 41 receives the electrical signal from the weight measuring means 40 at the predetermined interval, and decides based on the electrical signal whether or not the measured value of the weight of the reservoir 26 is being reduced at a predetermined rate. In the case where it is decided by the deciding means 41 that the measured value of the weight is being reduced at the predetermined rate, it is decided that the additive A in the reservoir 26 is being mixed into pure water in a predetermined addition amount, and the supply of the processing liquid to the cutting apparatus 1 is continued. In the case where it is decided by the deciding means 41 that the measured value of the weight is not being reduced at the predetermined rate, it is decided that the additive A in the reservoir 26 is not being injected into pure water in the predetermined addition amount, a warning is issued from warning means 42, and the processing at the cutting apparatus 1 is temporarily stopped. By this, cutting of the wafer by use of a processing liquid to which the additive A is not added properly is prevented from occurring at the cutting apparatus 1.

Note that the transfer pump control unit 29 and the deciding means 41 are each composed of a processor for executing various kinds of processing, a memory and the like. The memory is composed of one or a plurality of storage media selected from among ROMs (Read Only Memories), RAMs (Random Access Memories) and the like. In the memory, for example, a program for controlling various kinds of processing and the like are stored.

During when the additive A is injected through the injection pump 27 from the reservoir 26 containing the additive A into pure water flowing in the passage 31, the weight of the reservoir 26 is monitored by the weight measuring means 40. By this, it is known, in the case where the weight of the reservoir 26 is not being reduced, that the additive A is not being injected into pure water, and, therefore, improper injection of the additive A can be decided appropriately. In addition, it can be immediately detected that clogging has occurred in the passage 35 connecting from the reservoir 26 to the passage 31.

Figure 2:
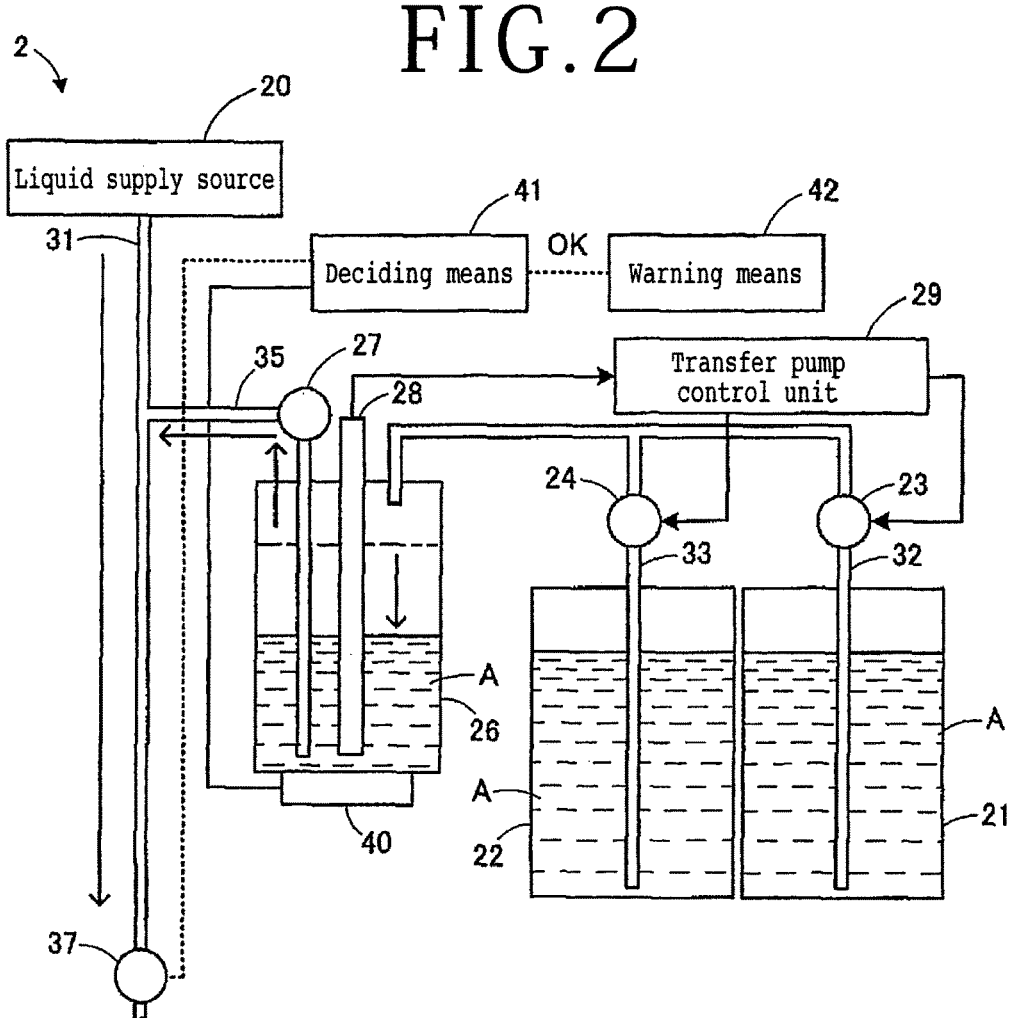
FIG. 2 is a figure showing an operation in the case where an additive according to the present embodiment is being injected properly.
Figure 3:
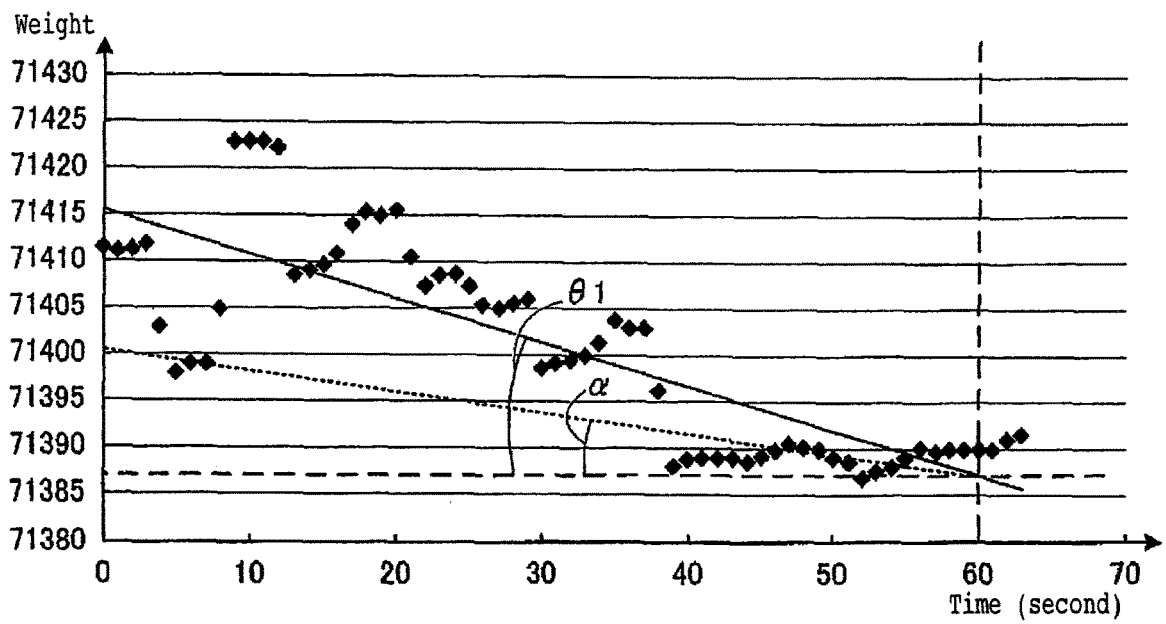
FIG. 3 is a diagram in which measured values of the weight of a reservoir in the case of FIG. 2 are plotted.
Figure 4:
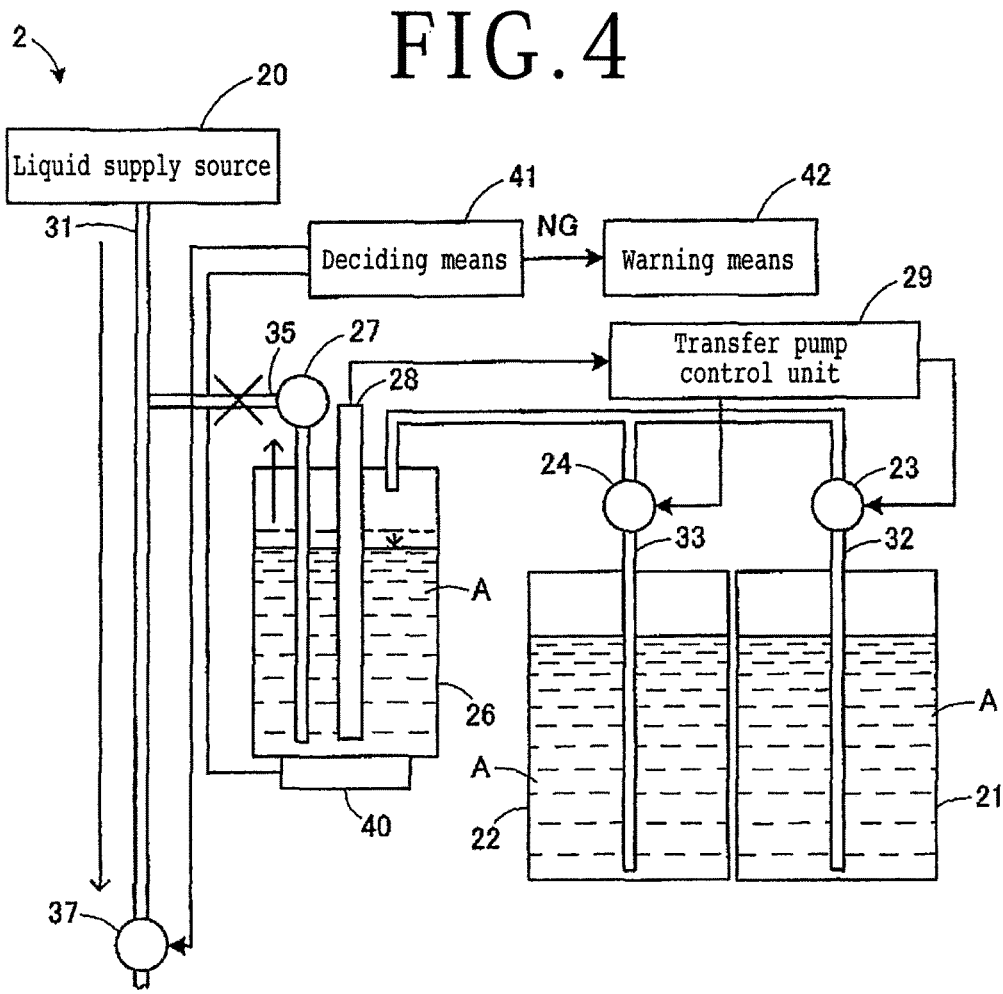
FIG. 4 is a figure showing an operation in the case where the additive according to the present embodiment is not being injected properly.
Figure 5:
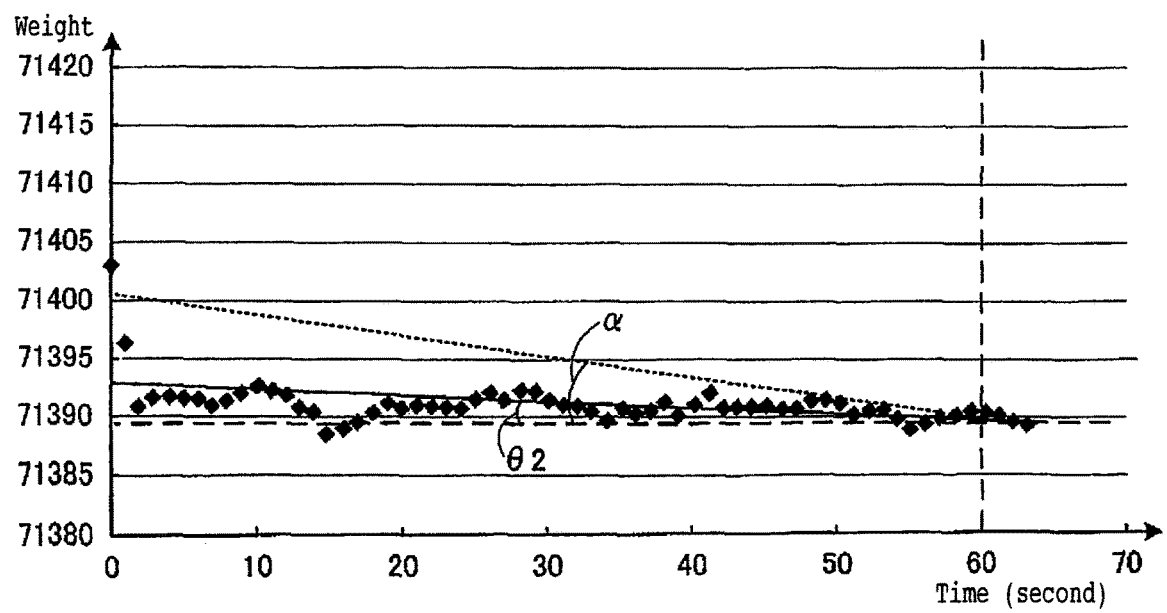
FIG. 5 is a diagram in which measured values of the weight of the reservoir in the case of FIG. 4 are plotted.

Now, an operation of injecting the additive A in the processing liquid supplying apparatus 2 will be described in detail below. FIG. 2 is a figure showing an operation in the case where the additive according to the present embodiment is being injected properly. FIG. 3 is a diagram in which measured values of the weight of the reservoir in the case of FIG. 2 are plotted. FIG. 4 is a figure showing an operation in the case where the additive according to the present embodiment is not being injected properly. FIG. 5 is a diagram in which measured values of the weight of the reservoir in the case of FIG. 4 are plotted. In FIGS. 2 and 4, arrows indicate the flows of pure water and the additive. In FIGS. 3 and 5, the axis of abscissas represents time, and the axis of ordinates represents weight.

As shown in FIG. 2, when the solenoid valve 37 is opened, pure water supplied from the liquid supply source 20 flows through the passage 31. The additive A in the reservoir 26 is injected by the injection pump 27 through the passage 35 into the passage 31, in which it is mixed with the pure water. The processing liquid with the additive A mixed therein is supplied to the nozzles 16 and 17 (see FIG. 1) of the cutting apparatus 1, and cutting is started. With the additive A injected into the passage 31, the amount of the additive A in the reservoir 26 is reduced.

In this instance, the weight of the reservoir 26 is reduced. During when the additive A in the reservoir 26 is injected into the passage 31, the weight measuring means 40 monitors the weight of the reservoir 26. The weight measuring means 40 measures the weight of the reservoir 26, converts the measured value of the weight into an electrical signal and sends the electrical signal to the deciding means 41, at an interval of one second, for example.

The deciding means 41 receives the data of the measured value of the weight at the interval of one second. As illustrated in FIG. 3, the deciding means 41 obtains a linear function straight line, based on plots over a period of 60 seconds, for example, of the data acquired at the interval of one second, by use of a least squares method, and calculates the inclination angle $\theta 1$ of the straight line. Then, the inclination angle $\theta 1$, which represents the rate at which the weight of the reservoir 26 is reduced, is compared with an angle $\alpha$ constituting a threshold. In the case where the inclination angle $\theta 1$ is not smaller than the angle $\alpha$, the deciding means 41 decides, for example after 61 seconds, that the weight of the reservoir 26 is being reduced at a predetermined rate. The deciding means 41 decides that the additive A is being injected into the passage 31 in a predetermined addition amount, and the solenoid valve 37 is kept open, whereby the supply of the processing liquid to the nozzles 16 and 17 (see FIG. 1) is continued.

As depicted in FIG. 4, when bending or clogging of the passage 35, for example, is generated during when cutting is continued, the additive A in the reservoir 26 is hampered from passing through the passage 35. With the injection of the additive A into the passage 31 thus hampered, the reduction in the amount of the additive A in the reservoir 26 decreases. In this instance, the variation in the weight of the reservoir 26 measured by the weight measuring means 40 decreases. The weight measuring means 40 measures the weight of the reservoir 26, converts the measured value of the weight into an electrical signal and sends the electrical signal to the deciding means 41, at an interval of one second.

The deciding means 41 receives the data at the interval of one second. As shown in FIG. 5, the deciding means 41 obtains a linear function straight line, based on the plot over 60 seconds, for example, of the data acquired at the interval of one second, by use of a least squares method, calculates the inclination angle $\theta 2$ of the straight line, and compares the inclination angle $\theta 2$ with the angle $\alpha$ constituting the threshold. In the case where the inclination angle $\theta 2$ is smaller than the angle $\alpha$, the deciding means 41 decides, for example after 61 seconds, that the weight of the reservoir 26 is not being reduced at the predetermined rate. The deciding means 41 decides that the additive A is not being injected into the passage 31 in the predetermined addition amount, and causes the warning means 42 to issue a warning. In addition, the deciding means 41 causes the solenoid valve 37 to be closed, to stop the supply of the processing liquid to the cutting apparatus 1 (not shown), and the processing of the wafer at the cutting apparatus 1 is temporarily stopped.

As the measurement of the weight is continued, the inclination angle calculated based on the plot varies. Therefore, in the deciding means 41, after it is decided after 61 seconds whether or not the weight is being reduced at the predetermined rate on the basis of the plot of the measured values over a period of 60 seconds, the inclination angle is calculated and compared with the angle $\alpha$ at an interval of one second. Note that the interval of measurement of the weight of the reservoir 26 by the weight measuring means 40 may not necessarily be one second; the period of measurement of the weight for obtaining the linear function straight line by use of the least squares method by the deciding means 41 may not necessarily be 60 seconds; and the time at which it is decided whether or not the weight is being reduced at the predetermined rate may not necessarily be after 61 seconds. The interval and periods of time can be set appropriately. In addition, the angle $\alpha$ constituting the threshold can be set, as required, according to the addition amount of the additive A in the processing liquid.

In this way, during when the additive A is injected through the injection pump 27 from the reservoir 26 into pure water flowing in the passage 31, the weight of the reservoir 26 is monitored by the weight measuring means 40, and the measured values of the weight measured at an interval of one second are transmitted to the deciding means 41. Based on the data of the weight over a period of 60 seconds, the deciding means 41 decides after 61 seconds whether or not the weight is reduced, and thereafter continues decision at an interval of one second. By this, whether or not the weight is being reduced at a predetermined rate can be detected on a real-time basis, and, therefore, it can be appropriately decided whether or not a predetermined quantity of the additive A is being injected into pure water. In addition, by monitoring the manner in which the amount of the additive A is reduced, it can be immediately determined that the reason for improper injection of the additive A is bending or clogging of the passage 35 connecting from the reservoir 26 to the passage 31. As a result of this, maintenance of the tube constituting the passage 35 can be carried out.

As has been described above, in the processing liquid supplying apparatus 2 according to the present embodiment, during when the additive A is injected through the injection pump 27 from the reservoir 26 containing the additive A into the liquid flowing in the passage 31, the weight of the reservoir 26 is measured by the weight measuring means 40, and whether or not the additive A is being injected into the liquid is decided based on whether or not the weight is being reduced. By this, in the case where the weight is not being reduced at a predetermined rate, it is known that a predetermined quantity of the additive A is not being injected into pure water, so that improper injection of the additive A can be decided appropriately. In addition, it can be immediately detected that clogging has occurred in the course from the reservoir 26 to the passage 31.

In the above embodiment, the warning means 42 is not specifically restricted. For example, a warning may be issued by use of at least one of a voice alarm, a display alarm and a light emission alarm. In addition, while a configuration in which the additive A contained in two additive containers, namely, the first additive container 21 and the second additive container 22 is transferred to the reservoir 26 has been adopted in the above embodiment, only one additive container may be used, or three or more additive containers may be used.

Besides, while a configuration in which the linear function straight line is determined based on the measured values of the weight of the reservoir 26 by use of the least squares method and the inclination angle of the straight line is calculated has been adopted in the above embodiment, the linear prediction method is not specifically restricted. In addition, the reduction in the weight may be decided by other method than comparison with the inclination angle. Besides, while a configuration in which a load cell is used as the weight measuring means 40 has been adopted in the above embodiment, a pressure sensor or the like may also be used so long as the weight of the reservoir 26 can be continuously measured thereby.

In addition, while the cutting apparatus for cutting a wafer has been taken as an example of the processing apparatus in describing the above embodiment, this configuration is not restrictive. The present invention is also applicable to other processing apparatuses that supply a liquid. For example, the present invention may be applied to the supply of a liquid in other processing apparatuses such as a grinding apparatus, a polishing apparatus, a laser processing apparatus, an edge trimming apparatus, a cleaning apparatus and a cluster apparatus configured by combining these apparatuses. For example, the present invention may be applied to the case of forming a protective film at the time of ablation, or may be applied to the case of supplying a cleaning liquid in a cleaning apparatus.

Besides, the embodiment of the present invention is not limited to the above-described embodiment, and various changes, replacements and modifications may be made without departing from the gist of the technical thought of the invention. Furthermore, if the technical thought of the present invention can be realized in a different manner, owing to the progress of technology or by other derived technology, the present invention may be carried out by the different method. Accordingly, the claims cover all the embodiments which can fall within the scope of the technical thought of the present invention. While a configuration in which the present invention is applied to a cutting apparatus for cutting a wafer has been described in the above embodiment, the invention is also applicable to other apparatuses than the processing apparatus that supply a liquid.

As has been described above, the present invention has an effect to enable appropriate determination of improper injection of an additive into a processing liquid, and is particularly useful for a processing liquid supplying apparatus for supplying a processing liquid.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing liquid supplying apparatus comprising:
a reservoir containing an additive to be added to a liquid flowing through a passage connected at its one end to a liquid supply source and connected at its other end to a processing apparatus, wherein the processing apparatus comprises a cutting apparatus including a rotatable cutting blade, and further wherein the liquid with the additive added thereto is supplied to side surfaces of the rotatable cutting blade;
an injection pump adapted to inject the additive in the reservoir into the passage;
weight measuring means for measuring the weight of the reservoir at a plurality of different points in time, separated by a predetermined interval, and converting each of the measured values of the weight into an electrical signal, when the liquid flows in the passage and the additive is injected;
deciding means for receiving the electrical signals from the weight measuring means and deciding whether or not the measured values show that the weight of the reservoir is being reduced at a predetermined rate; and
warning means for issuing a warning that injection is improper when it is decided by the deciding means that the measured values of the weight are not being reduced at the predetermined rate.

2. The processing liquid supplying apparatus according to claim 1, wherein the deciding means calculates an inclination angle of a linear function straight line based on a plurality of measured values of the weight by use of a least squares method at a predetermined time interval, and decides that the measured value of the weight is not being reduced at the predetermined rate when the inclination angle representing the reduction rate comes out of a predetermined range.

3. The processing liquid supplying apparatus according to claim 1, wherein the deciding means comprises a processor that is configured and arranged to calculate an inclination angle of a linear function straight line based on a plurality of measured values of the weight by use of a least squares method at a predetermined time interval, and to decide that the measured value of the weight is not being reduced at the predetermined rate when the inclination angle representing the reduction rate comes out of a predetermined range.

4. A processing liquid supplying apparatus comprising:
a reservoir containing an additive to be added to a liquid flowing through a passage connected at its one end to a liquid supply source and connected at its other end to a processing apparatus, wherein the processing apparatus comprises a cutting apparatus including a rotatable cutting blade, and further wherein the liquid with the additive added thereto is supplied to side surfaces of the rotatable cutting blade;
an injection pump adapted to inject the additive in the reservoir into the passage;
weight measuring means for measuring the weight of the reservoir and converting the measured value of the weight into an electrical signal at a predetermined interval during when the liquid flows in the passage and the additive is injected;
deciding means for receiving the electrical signal from the weight measuring means and deciding whether or not the measured value of the weight of the reservoir is being reduced at a predetermined rate; and
warning means for issuing a warning that injection is improper when it is decided by the deciding means that the measured value of the weight is not being reduced at the predetermined rate,
wherein the deciding means comprises a processor that is configured and arranged to calculate an inclination angle of a linear function straight line based on a plurality of measured values of the weight by use of a least squares method at a predetermined time interval, and to decide that the measured value of the weight is not being reduced at the predetermined rate when the inclination angle representing the reduction rate comes out of a predetermined range.

5. The processing liquid supplying apparatus according to claim 1, wherein the warning means is configured and arranged to warn a user that the measured values of the weight are not being reduced at the predetermined rate.

6. The processing liquid supplying apparatus according to claim 5, wherein the warning means comprises an alarm.

7. The processing liquid supplying apparatus according to claim 6, wherein the alarm comprises a voice alarm.

8. The processing liquid supplying apparatus according to claim 6, wherein the alarm comprises a display alarm.

9. The processing liquid supplying apparatus according to claim 6, wherein the alarm comprises a light emission alarm.

10. The processing liquid supplying apparatus according to claim 1, further comprising:
a valve positioned along said passage, wherein said valve is configured and arranged to be in either an open position in which the liquid is permitted to flow to the processing apparatus or a closed position in which liquid is prevented from flowing to the processing apparatus,
wherein said deciding means is configured and arranged to control said valve to be in the open position when the measured values show that the weight of the reservoir is being reduced at the predetermined rate and to control the valve to be in the closed position when the measured values show that the weight of the reservoir is not being reduced at the predetermined rate.

11. The processing liquid supplying apparatus according to claim 4, further comprising:
a valve positioned along said passage, wherein said valve is configured and arranged to be in either an open position in which the liquid is permitted to flow to the processing apparatus or a closed position in which liquid is prevented from flowing to the processing apparatus,
wherein said deciding means is configured and arranged to control said valve to be in the open position when the measured values show that the weight of the reservoir is being reduced at the predetermined rate and to control the valve to be in the closed position when the measured values show that the weight of the reservoir is not being reduced at the predetermined rate.

12. The processing liquid supplying apparatus according to claim 1, wherein the additive comprises an antistatic additive configured for preventing the liquid from being electrostatically charged.

13. The processing liquid supplying apparatus according to claim 4, wherein the additive comprises an antistatic additive configured for preventing the liquid from being electrostatically charged.

14. The processing liquid supplying apparatus according to claim 1, further comprising:
a liquid level detection sensor provided inside said reservoir;
a transfer pump configured and arranged for transferring the additive from an additive container to the reservoir; and
a transfer pump control unit configured and arranged to operate the transfer pump when the liquid level detection sensor detects that a liquid level within the reservoir is below a predetermined level.

15. The processing liquid supplying apparatus according to claim 4, further comprising:
a liquid level detection sensor provided inside said reservoir;
a transfer pump configured and arranged for transferring the additive from an additive container to the reservoir; and
a transfer pump control unit configured and arranged to operate the transfer pump when the liquid level detection sensor detects that a liquid level within the reservoir is below a predetermined level.

* * * * *